US012189063B2

(12) United States Patent
Ozeki et al.

(10) Patent No.: US 12,189,063 B2
(45) Date of Patent: Jan. 7, 2025

(54) DISTANCE-MEASURING IMAGING DEVICE

(71) Applicant: NUVOTON TECHNOLOGY CORPORATION JAPAN, Kyoto (JP)

(72) Inventors: Toshiaki Ozeki, Osaka (JP); Kazuo Matsukawa, Osaka (JP); Takumi Kato, Osaka (JP); Mitsuhiko Otani, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 881 days.

(21) Appl. No.: 17/345,490

(22) Filed: Jun. 11, 2021

(65) Prior Publication Data

US 2021/0302547 A1    Sep. 30, 2021

Related U.S. Application Data

(63) Continuation of application No. PCT/JP2019/049321, filed on Dec. 17, 2019.

(30) Foreign Application Priority Data

Dec. 18, 2018    (JP) .................................. 2018-236565

(51) Int. Cl.
| | |
|---|---|
| *G01S 7/48* | (2006.01) |
| *G01S 7/4861* | (2020.01) |
| *G01S 17/08* | (2006.01) |
| *G01S 17/894* | (2020.01) |
| *H03L 7/081* | (2006.01) |
| *H03L 7/089* | (2006.01) |

(52) U.S. Cl.
CPC ............ *G01S 7/4861* (2013.01); *G01S 17/08* (2013.01); *G01S 17/894* (2020.01); *H03L 7/0812* (2013.01); *H03L 7/0891* (2013.01)

(58) Field of Classification Search
None
See application file for complete search history.

(56) References Cited

U.S. PATENT DOCUMENTS 9,584,105 B1    2/2017  Foley

FOREIGN PATENT DOCUMENTS

| CN | 107272010 A | * | 10/2017 | ............. G01S 17/08 |
| DE | 102017106071 B3 | * | 3/2018 | ............. G01S 17/08 |

OTHER PUBLICATIONS

International Search Report and Written Opinion issued on Feb. 18, 2020 in International Patent Application No. PCT/JP2019/049321; with partial English translation.

* cited by examiner

*Primary Examiner* — Hovhannes Baghdasaryan
(74) *Attorney, Agent, or Firm* — Rimon P.C.

(57) ABSTRACT

A distance-measuring imaging device includes: a timing controller that outputs one or more timing signals; a light receiver that receives reflected light that is light emitted by a light source and reflected by a subject; a phase adjustment circuit that outputs at least one signal out of a light emission control signal and an exposure control signal, based on the one or more timing signals, the light emission control signal being used for causing the light source to emit light to the subject, the exposure control signal being used for causing the light receiver to start exposure. The phase adjustment circuit includes one or more DLL circuits each of which determines, for at least one of the one or more timing signals, at least one of a phase of a rising edge or a phase of a falling edge of the at least one signal.

10 Claims, 13 Drawing Sheets

DISTANCE-MEASURING IMAGING DEVICE

CROSS REFERENCE TO RELATED APPLICATIONS

This is a continuation application of PCT International Application No. PCT/JP2019/049321 filed on Dec. 17, 2019, designating the United States of America, which is based on and claims priority of Japanese Patent Application No. 2018-236565 filed on Dec. 18, 2018. The entire disclosures of the above-identified applications, including the specifications, drawings and claims are incorporated herein by reference in their entirety.

FIELD

The present disclosure relates to a distance-measuring imaging device.

BACKGROUND

There is a known distance-measuring imaging device that performs distance measurement using a flight time for which light makes a round trip to a subject (see, for example, Patent Literature (PTL) 1).

CITATION LIST

Patent Literature

PTL 1: U.S. Pat. No. 9,584,105

SUMMARY

Technical Problem

The present disclosure provides a distance-measuring imaging device that can perform distance measurement accurately.

Solution to Problem

A distance-measuring imaging device according to one aspect of the present disclosure includes: a timing controller that outputs one or more timing signals; a light receiver that receives reflected light that is light emitted by a light source and reflected by a subject; a phase adjustment circuit that outputs at least one signal out of a light emission control signal and an exposure control signal, based on the one or more timing signals, the light emission control signal being used for causing the light source to emit light to the subject, the exposure control signal being used for causing the light receiver to start exposure. The phase adjustment circuit includes one or more delay-locked loop (DLL) circuits each of which determines, for at least one of the one or more timing signals, at least one of a phase of a rising edge or a phase of a falling edge of the at least one signal.

Advantageous Effects

The present disclosure provides a distance-measuring imaging device that can perform distance measurement accurately.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
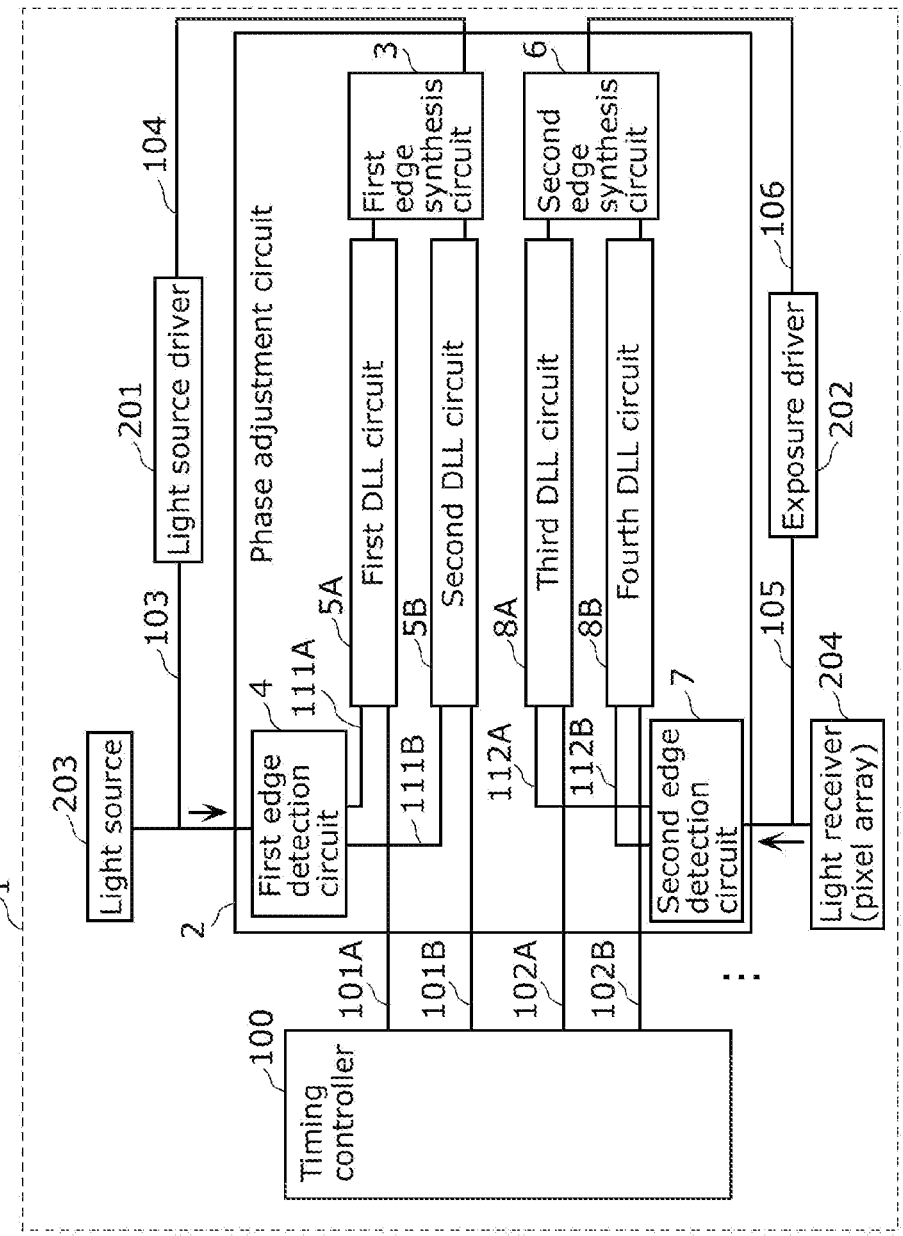
FIG. 1 is a block diagram showing an exemplary configuration of a distance-measuring imaging device according to Embodiment 1.

DESCRIPTION OF EMBODIMENTS (Underlying Knowledge Forming Basis of One Aspect of Present Disclosure)

In order to perform distance measurement accurately, a distance-measuring imaging device that performs distance measurement using a flight time for which light makes a round trip to a subject needs to determine light emission timings and exposure timings accurately.

Generally, a light emission timing or exposure timing varies due to a change in the surrounding environment (e.g., temperature) of a distance-measuring imaging device, a long-term degradation of the distance-measuring imaging device, etc.

For this reason, in order to perform distance measurement accurately, it is necessary to reduce a variation in light emission timing or exposure timing.

Patent Literature (PTL) 1 discloses a technique for reducing a variation in light emission timing or exposure timing using a digital circuit. However, since the technique disclosed by PTL 1 reduces the variation in light emission timing or exposure timing using the digital circuit, the technique can make the reduction using only a discrete value. Accordingly, a conventional distance-measuring imaging device using the technique disclosed by PTL 1 has certain limitations to accurate distance measurement.

In view of the above problem, the inventors have enthusiastically conducted examinations and experiments. As a result, the inventors have gained a new insight that distance measurement can be performed accurately by reducing a variation in light emission timing or exposure timing continuously using an analog feedback of a delay-locked loop (DLL) circuit.

The inventors have arrived at a distance-measuring imaging device according to one aspect of the present disclosure, based on the above-described new insight.

A distance-measuring imaging device according to one aspect of the present disclosure includes: a timing controller that outputs one or more timing signals; a light receiver that receives reflected light that is light emitted by a light source and reflected by a subject; a phase adjustment circuit that outputs at least one signal out of a light emission control signal and an exposure control signal, based on the one or more timing signals, the light emission control signal being used for causing the light source to emit light to the subject, the exposure control signal being used for causing the light receiver to start exposure. The phase adjustment circuit includes one or more delay-locked loop (DLL) circuits each of which determines, for at least one of the one or more timing signals, at least one of a phase of a rising edge or a phase of a falling edge of the at least one signal.

The distance-measuring imaging device thus configured can reduce a variation in light emission timing or exposure timing continuously using one or more analog feedbacks of the one or more DLL circuits. Accordingly, the distance-measuring imaging device thus configured can perform distance measurement accurately.

Moreover, the one or more DLL circuits may comprise a first DLL circuit that determines the phase of the rising edge of the at least one signal; and a second DLL circuit that determines the phase of the falling edge of the at least one signal, and the phase adjustment circuit may further include a first edge synthesis circuit that synthesizes the rising edge the phase of which has been determined by the first DLL circuit and the falling edge the phase of which has been determined by the second DLL circuit, to output the at least one signal.

Furthermore, the first DLL circuit may determine a phase of a rising edge of the light emission control signal, the second DLL circuit may determine a phase of a falling edge of the light emission control signal, the one or more DLL circuits may further comprise a third DLL circuit that determines a phase of a rising edge of the exposure control signal, and a fourth DLL circuit that determines a phase of a falling edge of the exposure control signal, the one or more timing signals may comprise a first timing signal, a second timing signal, a third timing signal, and a fourth timing signal, the phase adjustment circuit may further include: a first edge detection circuit that separates a first feedback signal outputted from a light source driver that drives the light source, into (i) a first edge detection signal synchronized with a rising edge of the first feedback signal and (ii) a second edge detection signal synchronized with a falling edge of the first feedback signal; and a second edge detection circuit that separates a second feedback signal outputted from an exposure driver that drives the light receiver, into (i) a third edge detection signal synchronized with a rising edge of the second feedback signal and (ii) a fourth edge detection signal synchronized with a falling edge of the second feedback signal, the first DLL circuit may compare the first timing signal and the first edge detection signal to determine the phase of the rising edge of the light emission control signal, the second DLL circuit may compare the second timing signal and the second edge detection signal to determine the phase of the falling edge of the light emission control signal, the third DLL circuit may compare the third timing signal and the third edge detection signal to determine the phase of the rising edge of the exposure control signal, the fourth DLL circuit may compare the fourth timing signal and the fourth edge detection signal to determine the phase of the falling edge of the exposure control signal, the first edge synthesis circuit may output the light emission control signal, and the phase adjustment circuit may further include a second edge synthesis circuit that synthesizes the rising edge the phase of which has been determined by the third DLL circuit and the falling edge the phase of which has been determined by the fourth DLL circuit, to output the exposure control signal.

Moreover, the distance-measuring imaging device may include the light source driver and the exposure driver.

Furthermore, the first DLL circuit may determine a phase of a rising edge of the light emission control signal, the second DLL circuit may determine a phase of a falling edge of the light emission control signal, the one or more DLL circuits may further comprise a third DLL circuit that determines a phase of a rising edge of the exposure control signal, and a fourth DLL circuit that determines a phase of a falling edge of the exposure control signal, the one or more timing signals may comprise a first timing signal, a second timing signal, a third timing signal, and a fourth timing signal, the phase adjustment circuit may further include: a first edge detection circuit that separates a first feedback signal outputted from a photoelectric converter that receives light directly from the light source, into (i) a first edge detection signal synchronized with a rising edge of the first feedback signal and (ii) a second edge detection signal synchronized with a falling edge of the first feedback signal; and a second edge detection circuit that separates a second feedback signal outputted from an exposure driver that drives the light receiver, into (i) a third edge detection signal synchronized with a rising edge of the second feedback signal and (ii) a fourth edge detection signal synchronized with a falling edge of the second feedback signal, the first DLL circuit may compare the first timing signal and the first edge detection signal to determine the phase of the rising edge of the light emission control signal, the second DLL circuit may compare the second timing signal and the second edge detection signal to determine the phase of the falling edge of the light emission control signal, the third DLL circuit may compare the third timing signal and the third edge detection signal to determine the phase of the rising edge of the exposure control signal, the fourth DLL circuit may compare the fourth timing signal and the fourth edge detection signal to determine the phase of the falling edge of the exposure control signal, the first edge synthesis circuit may output the light emission control signal, and the phase adjustment circuit may further include a second edge synthesis circuit that synthesizes the rising edge the phase of which has been determined by the third DLL circuit and the falling edge the phase of which has been determined by the fourth DLL circuit, to output the exposure control signal.

Moreover, the distance-measuring imaging device may include the photoelectric converter and the exposure driver.

Furthermore, at least one of the one or more DLL circuits may include a shift register that delays at least one of the one or more timing signals, and may output the at least one signal, based on the at least one of the one or more timing signals delayed by the shift register.

Moreover, at least one of the one or more DLL circuits may include: a loop filter; a charge pump that supplies voltage to the loop filter; and a switch that switches between electrically connecting and disconnecting the loop filter and the charge pump.

Furthermore, at least one of the one or more DLL circuits may include: a variable delay element; a fixed delay element that receives a signal received by the variable delay element; and a phase comparator that compares an output of the variable delay element and an output of the fixed delay element, and outputs a predetermined signal when a phase difference between the outputs satisfies a predetermined condition.

Moreover, the timing controller, the light receiver, and the phase adjustment circuit may be included in one semiconductor chip.

Hereinafter, specific examples of a distance-measuring imaging device according to one aspect of the present disclosure will be described with reference to the drawings. Each of the embodiments mentioned below shows a specific example of the present disclosure. The values, shapes, elements, the arrangement and connection of the elements, steps, the order of the steps, etc. are mere examples, and are not intended to limit the present disclosure. Moreover, the figures are schematic diagrams and are not necessarily precise illustrations.

Embodiment 1

FIG. 1 is a block diagram showing an exemplary configuration of distance-measuring imaging device 1 according to Embodiment 1.

As shown by FIG. 1, distance-measuring imaging device 1 includes timing controller 100, phase adjustment circuit 2, light source driver 201, exposure driver 202, light source 203, and light receiver 204.

Light source 203 emits light by being driven by light source driver 201. Light source 203 is realized by, for example, a light-emitting diode.

Light receiver 204 receives reflected light that is light emitted by light source 203 and reflected by a subject, and outputs a signal used for measuring a distance to the subject. The following description is based on an assumption that light receiver 204 is a pixel array configured by arranging, in a matrix, pixels each of which outputs an electrical signal corresponding to an exposure amount.

Timing controller 100 outputs: first timing signal 101A that specifies a timing for a rising edge of light emission control signal 104 used for causing light source 203 to emit light to the subject; second timing signal 101B that specifies a timing for a falling edge of light emission control signal 104; third timing signal 102A that specifies a timing for a rising edge of exposure control signal 106 used for causing light receiver 204 to start exposure; and fourth timing signal 102B that specifies a timing for a falling edge of exposure control signal 106.

Light source driver 201 outputs to light source 203 a signal that drives light source 203, based on light emission control signal 104.

Exposure driver 202 outputs to light receiver 204 a signal that drives light receiver 204, based on exposure control signal 106.

Phase adjustment circuit 2 outputs light emission control signal 104, based on first timing signal 101A and second timing signal 101B outputted by timing controller 100.

Moreover, phase adjustment circuit 2 outputs exposure control signal 106, based on third timing signal 102A and fourth timing signal 102B.

Phase adjustment circuit 2 obtains, as first feedback signal 103, a signal that is outputted by light source driver 201 and drives light source 203, and feeds back obtained first feedback signal 103 to light emission control signal 104. Moreover, phase adjustment circuit 2 obtains, as second feedback signal 105, a signal that is outputted by exposure driver 202 and drives light receiver 204, and feeds back obtained second feedback signal 105 to exposure control signal 106.

Phase adjustment circuit 2 includes first DLL circuit 5A, second DLL circuit 5B, third DLL circuit 8A, fourth DLL circuit 8B, first edge detection circuit 4, second edge detection circuit 7, first edge synthesis circuit 3, and second edge synthesis circuit 6.

First edge detection circuit 4 separates first feedback signal 103 into first edge detection signal 111A synchronized with a rising edge of first feedback signal 103, and second edge detection signal 111B synchronized with a falling edge of first feedback signal 103.

Figure 2:
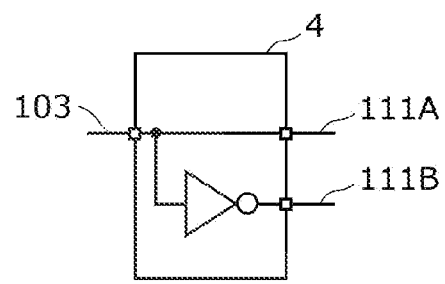
FIG. 2 is a block diagram showing an exemplary configuration of a first edge detection circuit according to Embodiment 1.

FIG. 2 is a block diagram showing an exemplary configuration of first edge detection circuit 4.

As shown by FIG. 2, first edge detection circuit 4 includes an inverter, outputs inputted first feedback signal 103 directly as first edge detection signal 111A, and outputs an inversion signal of inputted first feedback signal 103 as second edge detection signal 111B.

Referring back to FIG. 1 again, the description of distance-measuring imaging device 1 will continue.

Second edge detection circuit 7 separates second feedback signal 105 into third edge detection signal 112A synchronized with a rising edge of second feedback signal 105, and fourth edge detection signal 112B synchronized with a falling edge of second feedback signal 105.

Second edge detection circuit 7 has the same configuration as, for example, first edge detection circuit 4 shown by FIG. 2.

First DLL circuit 5A compares first timing signal 101A and first edge detection signal 111A to determine a phase of the rising edge of light emission control signal 104.

Second DLL circuit 5B compares second timing signal 101B and second edge detection signal 111B to determine a phase of the falling edge of light emission control signal 104.

Third DLL circuit 8A compares third timing signal 102A and third edge detection signal 112A to determine a phase of the rising edge of exposure control signal 106.

Fourth DLL circuit 8B compares fourth timing signal 102B and fourth edge detection signal 112B to determine a phase of the falling edge of exposure control signal 106.

First edge synthesis circuit 3 synthesizes the rising edge the phase of which has been determined by first DLL circuit 5A and the falling edge the phase of which has been determined by second DLL circuit 5B, to output light emission control signal 104.

Second edge synthesis circuit 6 synthesizes the rising edge the phase of which has been determined by third DLL circuit 8A and the falling edge the phase of which has been determined by fourth DLL circuit 8B, to output exposure control signal 106.

Figure 3:
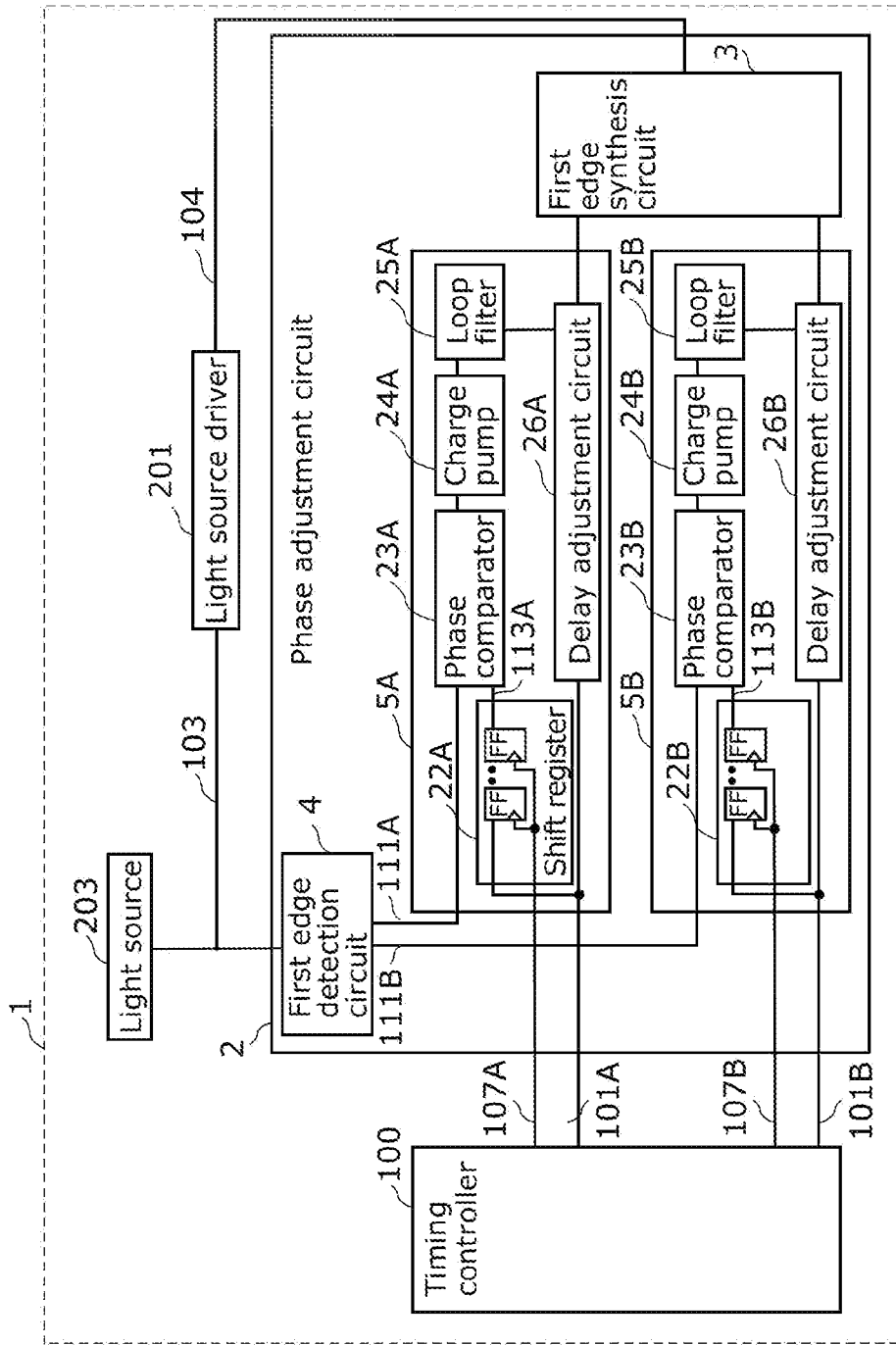
FIG. 3 is a block diagram showing an exemplary configuration of the distance-measuring imaging device according to Embodiment 1.

FIG. 3 is a block diagram showing the exemplary configuration of distance-measuring imaging device 1 in a more detailed manner than FIG. 1. In FIG. 3, part of the elements shown by FIG. 1 is omitted.

As shown by FIG. 3, first DLL circuit 5A includes shift register 22A, phase comparator 23A, charge pump 24A, loop filter 25A, and delay adjustment circuit 26A. Moreover, second DLL circuit 5B includes shift register 22B, phase comparator 23B, charge pump 24B, loop filter 25B, and delay adjustment circuit 26B.

Shift register 22A and shift register 22B are similar circuits, charge pump 24A and charge pump 24B are similar circuits, loop filter 25A and loop filter 25B are similar circuits, and delay adjustment circuit 26A and delay adjustment circuit 26B are similar circuits. To put it another way, first DLL circuit 5A and second DLL circuit 5B are similar circuits. Moreover, though not shown by FIG. 3, third DLL circuit 8A and fourth DLL circuit 8B are circuits similar to first DLL circuit 5A.

On top of first timing signal 101A, second timing signal 101B, third timing signal 102A, and fourth timing signal 102B, timing controller 100 further outputs: first phase reference signal 107A that is a clock signal; second phase reference signal 107B that is a clock signal in the same clock period as first phase reference signal 107A; a third phase reference signal (not shown) that is a clock signal; and a fourth phase reference signal (not shown) that is a clock signal in the same clock period as the third phase reference signal.

Shift register 22A receives first timing signal 101A and first phase reference signal 107A, delays first timing signal 101A by the k-th time of the clock period of first phase reference signal 107A, k being an integer greater than or equal to 1, and outputs first delay timing signal 113A synchronized with first phase reference signal 107A. Shift register 22A is realized by, for example, k flip-flops (FFs) connected in series as shown by FIG. 3.

Phase comparator 23A compares a phase of first edge detection signal 111A and a phase of first delay timing signal 113A. When the phase of first edge detection signal 111A lags behind the phase of first delay timing signal 113A, phase comparator 23A outputs to charge pump 24A an up signal indicating that the phase of first edge detection signal 111A lags behind the phase of first delay timing signal 113A; and when the phase of first edge detection signal 111A is ahead of the phase of first delay timing signal 113A, phase comparator 23A outputs to charge pump 24A a down signal Indicating that the phase of first edge detection signal 111A is ahead of the phase of first delay timing signal 113A.

When phase comparator 23A outputs the up signal to charge pump 24A, charge pump 24A increases an output voltage; and when phase comparator 23A outputs the down signal to charge pump 24A, charge pump 24A decreases an output voltage.

Loop filter 25A smoothes an output voltage outputted by charge pump 24A, and supplies the output voltage to delay adjustment circuit 26A.

Delay adjustment circuit 26A delays first timing signal 101A in accordance with a supplied voltage so that a delay time decreases with an increase in supplied voltage, and a delay time increases with a decrease in supplied voltage.

With the above configuration, first DLL circuit 5A delays first timing signal 101A so that first edge detection signal 111A is in phase with first delay timing signal 113A. To put it another way, first DLL circuit 5A determines a timing for a rising edge of light emission control signal 104 so that first timing signal 101A is in phase with first delay timing signal 113A.

As stated above, first DLL circuit 5A and second DLL circuit 5B are similar circuits. For this reason, as is the case in first DLL circuit 5A, second DLL circuit 5B delays second timing signal 101B so that second edge detection signal 111B is in phase with second delay timing signal 113B. To put it another way, second DLL circuit 5B determines a timing for a rising edge of light emission control signal 104 so that second timing signal 101B is in phase with second delay timing signal 113B.

Figure 4:
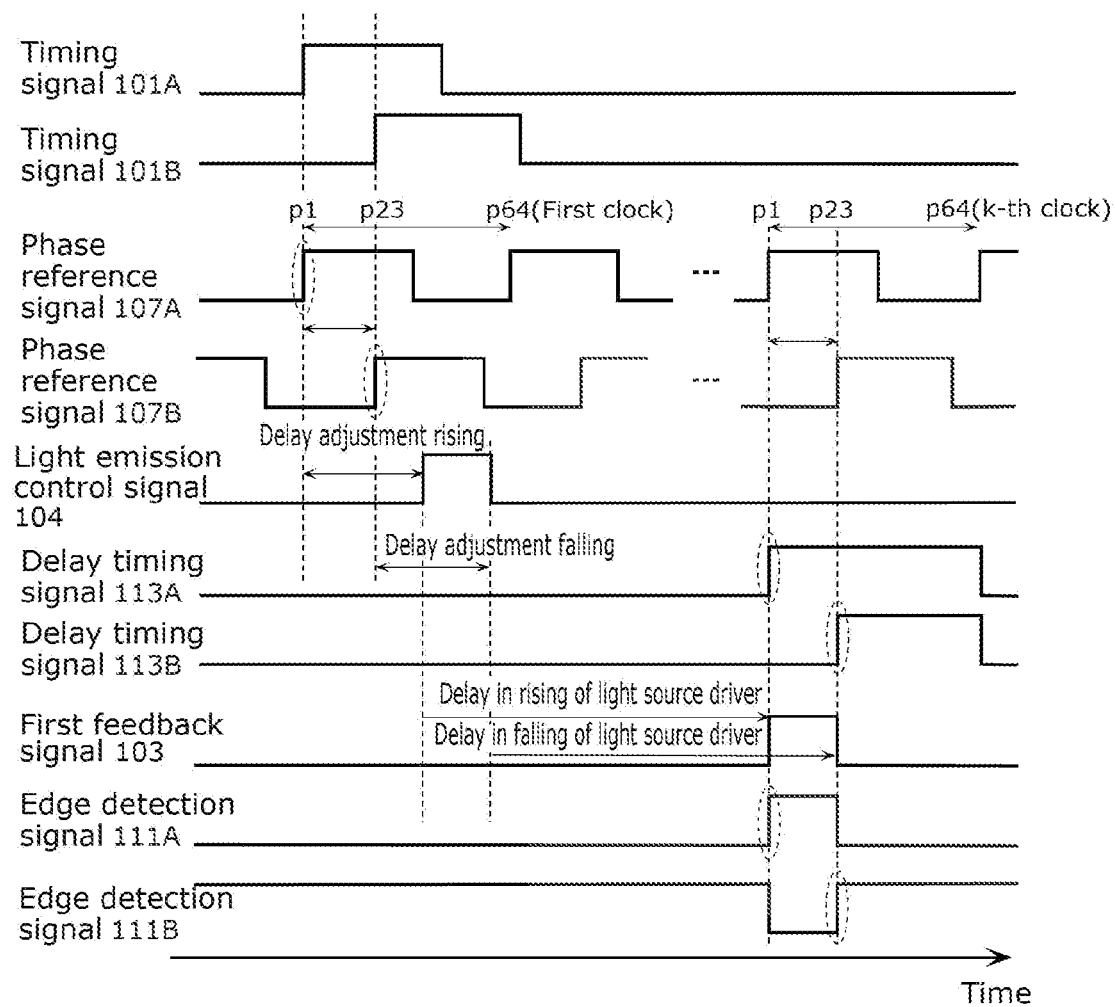
FIG. 4 is a timing diagram showing exemplary operations of a first DLL circuit and a second DLL circuit according to Embodiment 1.

FIG. 4 is a timing diagram showing exemplary operations of first DLL circuit 5A and second DLL circuit 5B. In FIG. 4, first phase reference signal 107A is in first phase p1 that is a 1/64 phase of a clock period, and second phase reference signal 107B is in twenty-third phase p23 that is a 1/64 phase of the clock period.

As shown by FIG. 4, first DLL circuit 5A delays first timing signal 101A so that a timing for a rising edge of first feedback signal 103 is synchronized with a timing for a rising edge of first delay timing signal 113A.

Accordingly, even when a delay time from when light source driver 201 receives a rising edge of light emission control signal 104 to when light source driver 201 outputs a rising edge of a signal that drives light source 203 varies due to a change in the surrounding environment (e.g., temperature) of distance-measuring imaging device 1, a long-term degradation of distance-measuring imaging device 1, etc., phase adjustment circuit 2 can continuously reduce, using an analog feedback of first DLL circuit 5A, a variation in delay time from when timing controller 100 outputs first timing signal 101A to when light source driver 201 outputs the rising edge of the signal that drives light source 203.

Here, a timing for the rising edge of the signal that drives light source 203 corresponds to a timing at which light source 203 starts to emit light.

Accordingly, distance-measuring imaging device 1 can reduce a variation in light emission timing, especially a variation in light emission start timing, accurately.

Moreover, as shown by FIG. 4, second DLL circuit 5B delays second timing signal 101B so that a timing for a falling edge of first feedback signal 103 is synchronized with a timing for a rising edge of second delay timing signal 113B.

Accordingly, even when a delay time from when light source driver 201 receives a falling edge of light emission control signal 104 to when light source driver 201 outputs a falling edge of a signal that drives light source 203 varies due to a change in the surrounding environment (e.g., temperature) of distance-measuring imaging device 1, a long-term degradation of distance-measuring imaging device 1, etc., phase adjustment circuit 2 can continuously reduce, using an analog feedback of second DLL circuit 5B, a variation in delay time from when timing controller 100 outputs second timing signal 101B to when light source driver 201 outputs the falling edge of the signal that drives light source 203.

Here, a timing for the falling edge of the signal that drives light source 203 corresponds to a timing at which light source 203 stops emitting light.

Accordingly, distance-measuring Imaging device 1 can reduce a variation in light emission timing, especially a variation in light emission stop timing, accurately.

Though not shown by FIG. 4, as is the case in first DLL circuit 5A, third DLL circuit 8A delays third timing signal 102A so that a timing for a rising edge of second feedback signal 105 is synchronized with a timing for a rising edge of the third delay timing signal.

Accordingly, even when a delay time from when exposure driver 202 receives a rising edge of exposure control signal 106 to when exposure driver 202 outputs a rising edge of a signal that drives light receiver 204 varies due to a change in the surrounding environment (e.g., temperature) of distance-measuring imaging device 1, a long-term degradation of distance-measuring imaging device 1, etc., phase adjustment circuit 2 can continuously reduce, using an analog feedback of third DLL circuit 8A, a variation in delay time from when timing controller 100 outputs third timing signal 102A to when exposure driver 202 outputs the rising edge of the signal that drives light receiver 204.

Here, a timing for the rising edge of the signal that drives light receiver 204 corresponds to a timing at which light receiver 204 starts exposure.

Accordingly, distance-measuring imaging device 1 can reduce a variation in exposure timing, especially a variation in exposure start timing, accurately.

Though not shown by FIG. 4, as is the case in second DLL circuit 5B, fourth DLL circuit 8B delays fourth timing signal 102B so that a timing for a falling edge of second feedback signal 105 is synchronized with a timing for a rising edge of the fourth delay timing signal.

Accordingly, even when a delay time from when exposure driver 202 receives a falling edge of exposure control signal 106 to when exposure driver 202 outputs a falling edge of a signal that drives light receiver 204 varies due to a change in the surrounding environment (e.g., temperature) of distance-measuring imaging device 1, a long-term degradation of distance-measuring imaging device 1, etc., phase adjustment circuit 2 can continuously reduce, using an analog feedback of fourth DLL circuit 8B, a variation in delay time from when timing controller 100 outputs fourth timing signal 102B to when exposure driver 202 outputs the falling edge of the signal that drives light receiver 204.

Here, a timing for the rising edge of the signal that drives light receiver 204 corresponds to a timing at which light receiver 204 stops exposure.

Accordingly, distance-measuring imaging device 1 can reduce a variation in exposure timing, especially a variation in exposure stop timing, accurately.

As stated above, distance-measuring imaging device 1 thus configured can reduce a variation in light emission timing and a variation in exposure timing accurately. Accordingly, distance-measuring imaging device 1 thus configured can perform distance measurement accurately.

Figure 5:
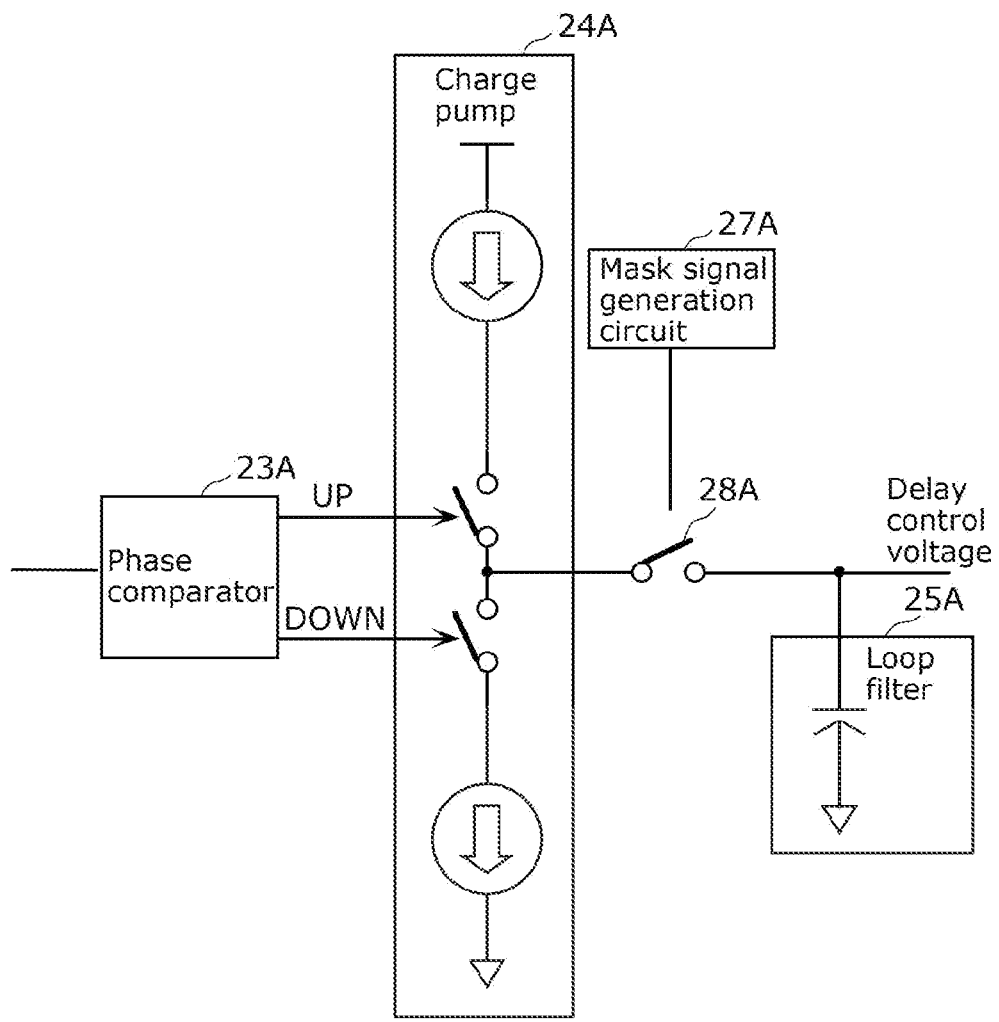
FIG. 5 is a block diagram showing a connection relationship between a phase comparator, a charge pump, and a loop filter in the first DLL circuit according to Embodiment 1.

FIG. 5 is a block diagram showing a connection relationship between phase comparator 23A, charge pump 24A, and loop filter 25A in first DLL circuit 5A.

As shown by FIG. 5, first DLL circuit 5A further includes switch 28A and mask signal generation circuit 27A omitted from FIG. 3, and charge pump 24A and loop filter 25A are connected via switch 28A.

Switch 28A switches between electrically connecting and disconnecting loop filter 25A and charge pump 24A. More specifically, when a mask signal outputted by mask signal generation circuit 27A becomes an on-state in a low level period, switch 28A puts an electrical connection between loop filter 25A and charge pump 24A into a connection state; and when the mask signal becomes an off-state in a high level period, switch 28 puts an electrical connection between loop filter 25A and charge pump 24A into a non-connection state.

When the electrical connection between loop filter 25A and charge pump 24A is put into the non-connection state, leakage of electric charges from loop filter 25A caused by charge pump 24A is reduced. Accordingly, when the electrical connection between loop filter 25A and charge pump 24A is put into the non-connection state, the hold voltage of loop filter 25A is maintained at high accuracy.

Figure 6:
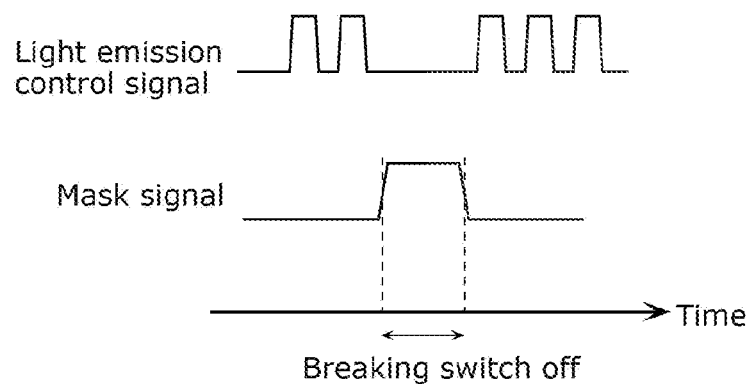
FIG. 6 is a timing diagram showing exemplary operations of a mask signal generation circuit according to Embodiment 1.

FIG. 6 is a timing diagram showing exemplary operations of mask signal generation circuit 27A.

As shown by FIG. 6, mask signal generation circuit 27A changes a mask signal to a high level in a period for which light emission control signal 104 is not outputted continuously.

With this, when no first edge detection signal 111A is inputted in a state in which a delay is locked, first DLL circuit 5A can keep constant an output voltage that loop filter 25A supplies to delay adjustment circuit 26A. For this reason, first DLL circuit 5A can reduce a variation in phase of a rising edge of light emission control signal 104 in a standby period for which no first edge detection signal 111A is inputted.

As stated above, second DLL circuit 5B is a circuit similar to first DLL circuit 5A. For this reason, as is the case in first DLL circuit 5A, second DLL circuit 5B can reduce a variation in phase of a falling edge of light emission control signal 104 in a standby period for which no second edge detection signal 111B is inputted.

As stated above, third DLL circuit 8A is a circuit similar to first DLL circuit 5A. For this reason, as is the case in first DLL circuit 5A, third DLL circuit 8A can reduce a variation in phase of a rising edge of exposure control signal 106 in a standby period for which no third edge detection signal 112A is inputted.

As stated above, fourth DLL circuit 8B is a circuit similar to first DLL circuit 5A. For this reason, as is the case in first DLL circuit 5A, fourth DLL circuit 8B can reduce a variation in phase of a falling edge of exposure control signal 106 in a standby period for which no fourth edge detection signal 112B is inputted.

Figure 7A:
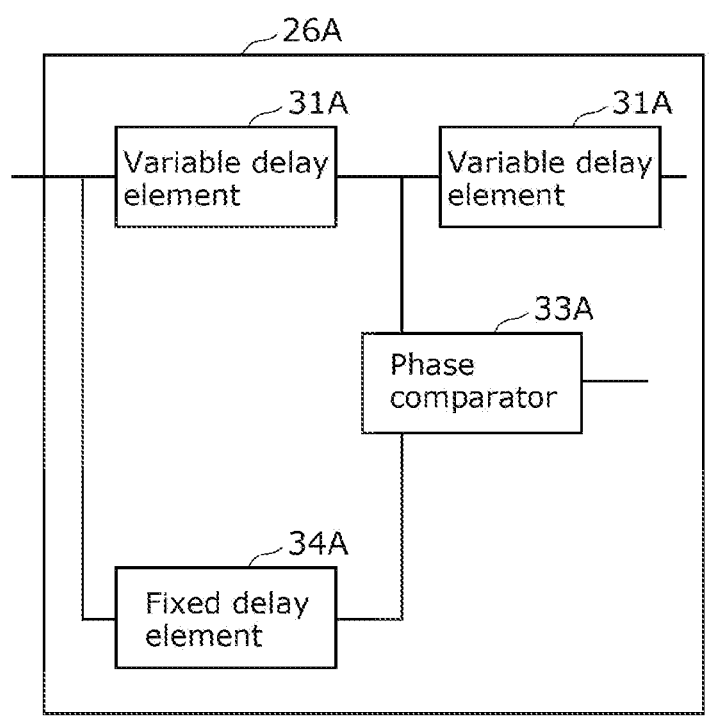
FIG. 7A is a block diagram showing an exemplary configuration of a phase adjustment circuit according to Embodiment 1.

FIG. 7A is a block diagram showing an exemplary configuration of delay adjustment circuit 26A.

As shown by FIG. 7A, delay adjustment circuit 26A includes variable delay elements 31A, fixed delay element 32A, and phase comparator 33A.

Figure 7B:
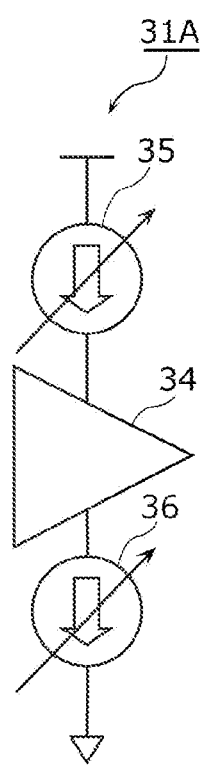
FIG. 7B is a block diagram showing an exemplary configuration of a variable delay element according to Embodiment 1.

FIG. 7B is a block diagram showing an exemplary configuration of variable delay element 31A.

As shown by FIG. 7B, variable delay element 31A includes buffer 34, variable current source 35, and variable current source 36.

Variable current source 35 controls a current that flows into buffer 34, in response to a voltage supplied from loop filter 25A. More specifically, variable current source 35 controls a current that flows into buffer 34 so that the current increases with an increase in voltage supplied from loop filter 25A, and decreases with a decrease in voltage supplied from loop filter 25A.

Variable current source 36 controls a current that flows from buffer 34, in response to a voltage supplied from loop filter 25A. More specifically, variable current source 36 controls a current that flows from buffer 34 so that the current increases with an increase in voltage supplied from loop filter 25A, and decreases with a decrease in voltage supplied from loop filter 25A.

Buffer 34 decreases a delay time with an increase in inflowing current and outflowing current, and increases a delay time with a decrease in inflowing current and outflowing current.

Figure 7C:
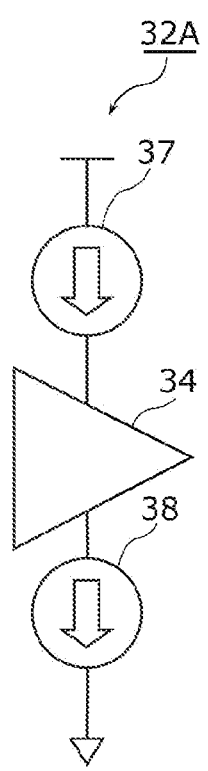
FIG. 7C is a block diagram showing an exemplary configuration of a fixed delay element according to Embodiment 1.

FIG. 7C is a block diagram showing a configuration of fixed delay element 32A.

As shown by FIG. 7C, fixed delay element 32A includes buffer 34, fixed current source 37, and fixed current source 38.

Fixed current source 37 is a replica circuit of variable current source 35. More specifically, fixed current source 37 is a replica circuit of variable current source 35 for which a current that flows into buffer 34 is fixed in a state in which the current that flows into buffer 34 is maximum or minimum.

Fixed current source 38 is a replica circuit of variable current source 36. More specifically, fixed current source 38 is a replica circuit of variable current source 35 for which a current that flows from buffer 34 is fixed in a state in which the current that flows from buffer 34 is maximum or minimum.

With the above configuration, fixed delay element 32A is a replica circuit of variable delay element 31A that is fixed in a state in which a delay time is minimum or maximum.

Referring back to FIG. 7A again, the description of delay adjustment circuit 26A will continue.

As shown by FIG. 7A, fixed delay element 32A receives a signal received by variable delay element 31A.

Phase comparator 33A compares an output of variable delay element 31A and an output of fixed delay element 32A, and outputs a predetermined signal when a phase difference between the output of variable delay element 31A and the output of fixed delay element 32A satisfies a predetermined condition. More specifically, when there is no phase difference between the output of variable delay element 31A and the output of fixed delay element 32A, phase comparator 33A outputs a first initialization signal for initializing determination of a phase of a rising edge of light emission control signal 104 by first DLL circuit 5A.

When phase comparator 33A outputs the first initialization signal, first DLL circuit 5A initializes the determination of the rising edge of light emission control signal 104 by, for example, causing charge pump 24A to output an initial value (e.g., an intermediate value between the maximum output voltage and the minimum output voltage) of an output voltage.

Generally, a delay lock of a DLL circuit may be released due to a disturbance such as noise contamination to an input signal and noise contamination to a power source. Moreover, generally, a state in which a delay time of a variable delay element included in the DLL circuit is minimum or maximum is a state in which the delay lock of the DLL circuit is released.

In contrast, when a delay time of variable delay element 31A is minimum or maximum, that is, when a delay lock of first DLL circuit 5A thus configured is released, first DLL circuit 5A initializes determination of a phase of a rising edge of light emission control signal 104. For this reason, when the delay lock is released by some sort of a factor, first DLL circuit 5A can start sweeping of a delay lock operation over immediately.

As stated above, second DLL circuit 5B is a circuit similar to first DLL circuit 5A. For this reason, when a delay lock of second DLL circuit 5B is released by some sort of a factor, second DLL circuit 5B can start sweeping of a delay lock operation over immediately as is the case in first DLL circuit 5A.

As stated above, third DLL circuit 8A is a circuit similar to first DLL circuit 5A. For this reason, when a delay lock of third DLL circuit 8A is released by some sort of a factor, third DLL circuit 8A can start sweeping of a delay lock operation over immediately as is the case in first DLL circuit 5A.

As stated above, fourth DLL circuit 8B is a circuit similar to first DLL circuit 5A. For this reason, when a delay lock of fourth DLL circuit 8B is released by some sort of a factor, fourth DLL circuit 8B can start sweeping of a delay lock operation over immediately as is the case in first DLL circuit 5A.

Embodiment 2

Hereinafter, a distance-measuring imaging device according to Embodiment 2 configured by changing part of the configuration of distance-measuring imaging device 1 according to Embodiment 1 will be described. In the following description, among elements of the distance-measuring imaging device according to Embodiment 2, elements similar to those of distance-measuring imaging device 1 according to Embodiment 1 are assigned the same reference signs, and the detailed description thereof will be omitted, as they have already been described. Moreover, the following description mainly focuses on differences between distance-measuring imaging device 1 according to Embodiment 1 and the distance-measuring imaging device according to Embodiment 2.

Figure 8:
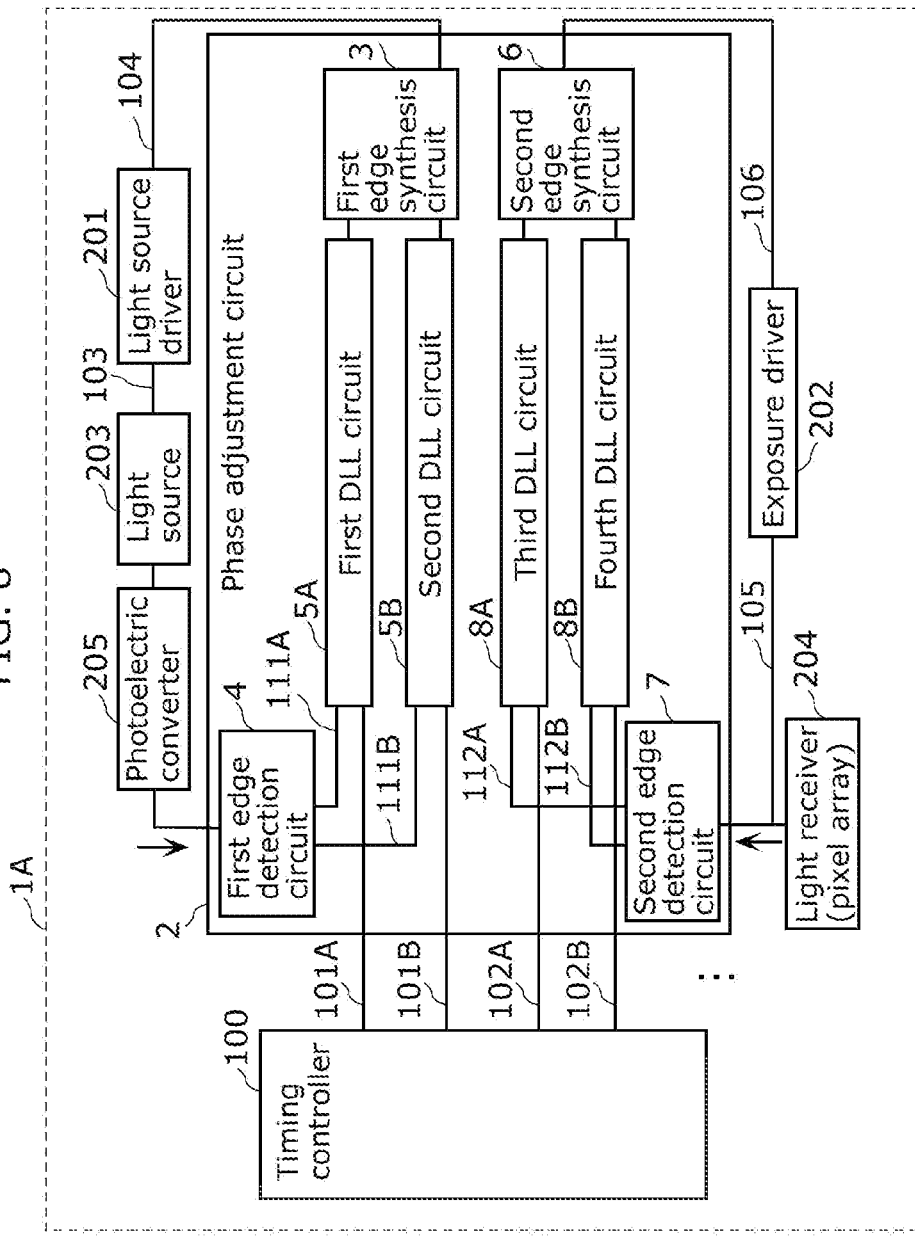
FIG. 8 is a block diagram showing an exemplary configuration of a distance-measuring imaging device according to Embodiment 2.

FIG. 8 is a block diagram showing an exemplary configuration of distance-measuring Imaging device 1A according to Embodiment 2.

As shown by FIG. 8, distance-measuring imaging device 1A is configured by adding photoelectric converter 205 to distance-measuring imaging device 1 according to Embodiment 1, and is also configured in that phase adjustment circuit 2 obtains, as first feedback signal 103, a light emission detection signal (to be described later) outputted by photoelectric converter 205.

When light source 203 emits light, photoelectric converter 205 directly receives the light emitted by light source 203, and outputs a light emission detection signal indicating that light source 203 has emitted the light. Here, a light emission detection signal changes to a high level in a period for which photoelectric converter 205 is directly receiving light emitted by light source 203, and a light emission detection signal changes to a low level in other periods. Photoelectric converter 205 is realized by, for example, a photodiode.

Phase adjustment circuit 2 obtains, as first feedback signal 103, a light emission detection signal outputted by photoelectric converter 205.

Even when a delay time from when light source driver 201 and light source 203 receive a rising edge of light emission control signal 104 to when light source 203 starts to emit light varies due to a change in the surrounding environment (e.g., temperature) of distance-measuring imaging device 1A, a long-term degradation of distance-measuring imaging device 1A, etc., by obtaining a light emission detection signal as first feedback signal 103, phase adjustment circuit 2 can continuously reduce, using an analog feedback of first DLL circuit 5A, a variation in delay time from when timing controller 100 outputs first timing signal 101 to when light source 203 starts to emit light. Moreover, even when a delay time from when light source driver 201 and light source 203 receive a falling edge of light emission control signal 104 to when light source 203 stops emitting light varies due to a change in the surrounding environment (e.g., temperature) of distance-measuring imaging device 1A, a long-term degradation of distance-measuring imaging device 1A, etc., phase adjustment circuit 2 can continuously reduce, using an analog feedback of second DLL circuit 5B, a variation in delay time from when timing controller 100 outputs second timing signal 101B to when light source 203 stops emitting light.

Accordingly, distance-measuring imaging device 1A can reduce a variation in light emission timing accurately.

Moreover, distance-measuring imaging device 1A can reduce a variation in exposure timing accurately as is the case in distance-measuring Imaging device 1 according to Embodiment 1.

As stated above, distance-measuring imaging device 1A thus configured can reduce a variation in light emission timing and a variation in exposure timing accurately. Accordingly, distance-measuring imaging device 1A thus configured can perform distance measurement accurately.

Embodiment 3

Hereinafter, a distance-measuring imaging device according to Embodiment 3 configured by changing part of the configuration of distance-measuring imaging device 1 according to Embodiment 1 will be described. In the following description, among elements of the distance-measuring imaging device according to Embodiment 3, elements similar to those of distance-measuring imaging device 1 according to Embodiment 1 are assigned the same reference signs, and the detailed description thereof will be omitted, as they have already been described. Moreover, the following description mainly focuses on differences between distance-measuring imaging device 1 according to Embodiment 1 and the distance-measuring imaging device according to Embodiment 3.

Figure 9:
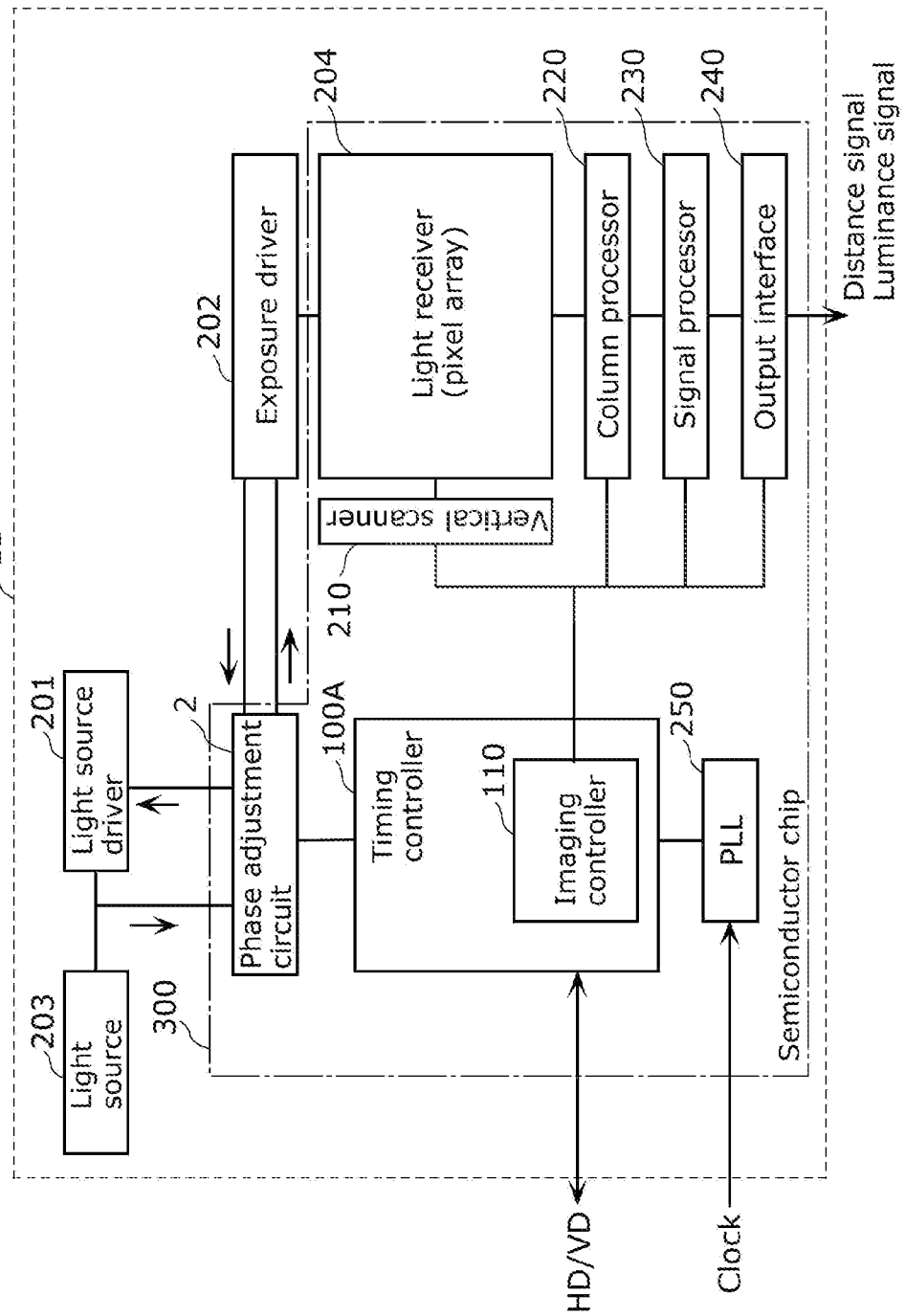
FIG. 9 is a block diagram showing an exemplary configuration of a distance-measuring imaging device according to Embodiment 3.

FIG. 9 is a block diagram showing an exemplary configuration of distance-measuring imaging device 1B according to Embodiment 3.

As shown by FIG. 9, distance-measuring imaging device 1B includes light source 203, light source driver 201, exposure driver 202, and semiconductor chip 300.

Phase adjustment circuit 2, timing controller 100A, light receiver 204, vertical scanner 210, column processor 220, signal processor 230, output interface 240, and phase-locked loop (PLL) 250 are integrated into semiconductor chip 300.

Timing controller 100A is configured by adding Imaging controller 110 to timing controller 100 according to Embodiment 1.

Imaging controller 110 generates an imaging control signal that controls vertical scanner 210, column processor 220, signal processor 230, and output interface 240.

Vertical scanner 210 controls an operation of reading out, for each column, electrical signals from pixels included in light receiver 204, and an operation of sequentially transmitting the read electrical signals to column processor 220.

Column processor 220 generates an imaging signal in response to the electrical signals transmitted by light receiver 204 for each column.

Signal processor 230 performs arithmetic processing based on the imaging signal generated by column processor 220, and generates a distance signal indicating a distance to a subject and a luminance signal indicating the luminance of the subject. Here, signal processor 230 is assumed to calculate a distance to a subject using a TOF distance measurement method.

Hereinafter, the calculation of a distance to a subject by the TOF distance measurement method performed by signal processor 230 will be described with reference to the drawings.

Figure 10:
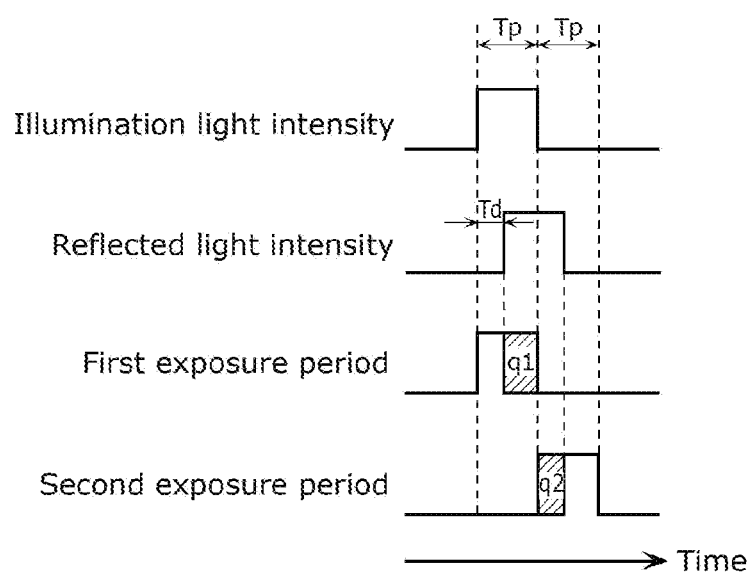
FIG. 10 is a timing diagram showing a relationship between light emission timing and exposure timing when a distance to a subject is calculated.

FIG. 10 is a timing diagram showing a relationship between a light emission timing of light source 203 and an exposure timing of light receiver 204 when signal processor 230 calculates a distance to a subject using the TOF distance measurement method.

In FIG. 10, Tp indicates a light emission period for which light source 203 emits light to a subject, and Td indicates a delay time from when light source 203 emits light to the subject to when reflected light that is the light reflected by the subject returns to light receiver 204. A first exposure period is the same timing as the light emission period for which light source 203 emits the light to the subject, and a second exposure period is a timing that ranges from the end of the first exposure period to the elapse of light emission period Tp.

In FIG. 10, q1 indicates an exposure amount of reflected light in one pixel included in light receiver 204 in the first exposure period, and q2 indicates an exposure amount of reflected light in the one pixel in the second exposure period.

By performing light emission by light source 203 and exposure by light receiver 204 at timings shown by FIG. 10, it is possible to represent distance d to a subject from each pixel included in light receiver 204 by the following equation (Equation 1) with c as the speed of light.

$$d = c \times Tp/2 \times q1/(q1+q2) \qquad \text{Equation 1}$$

In consequence, signal processing 230 can calculate a distance to a subject using Equation 1, based on an imaging signal generated by column processor 220.

Referring back to FIG. 9 again, the description of distance-measuring imaging device 1B will continue.

Output interface 240 outputs the distance signal and luminance signal generated by signal processor 230 to the outside.

PLL 250 appropriately performs frequency multiplication or frequency division on a clock inputted from outside, and provides the clock to timing controller 100A.

Distance-measuring imaging device 1C can reduce a variation in light emission timing and a variation in exposure timing accurately as is the case in distance-measuring imaging device 1 according to Embodiment 1. Accordingly, distance-measuring imaging device 1C thus configured can perform distance measurement accurately.

Figure 11:
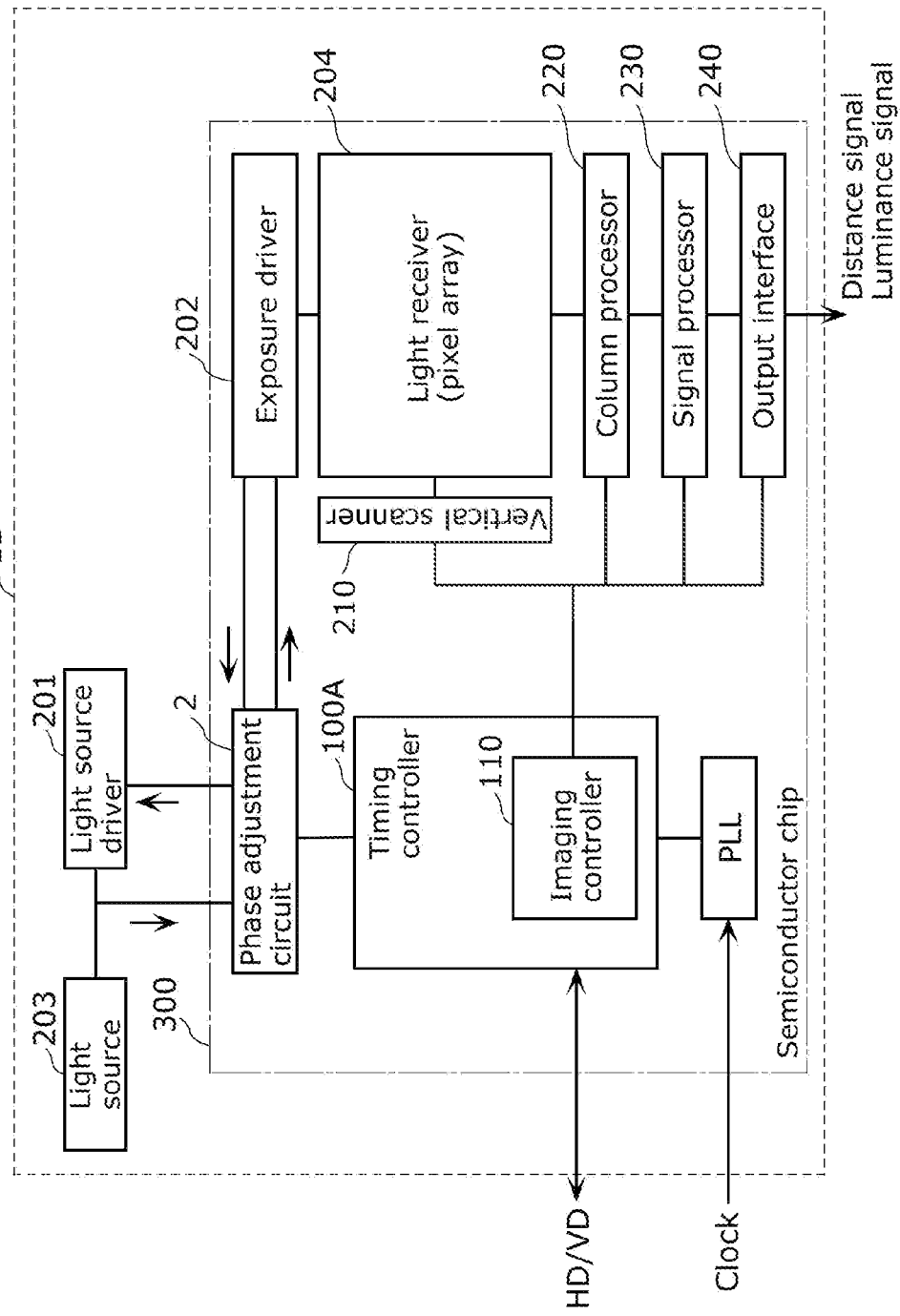
FIG. 11 is a block diagram showing an exemplary configuration of a distance-measuring imaging device according to Embodiment 3.

It should be noted that distance-measuring imaging device 1C has been described as including exposure driver 202 outside semiconductor chip 300 as shown by FIG. 9. Distance-measuring imaging device 1C, however, may have a configuration in which, for example, exposure driver 202 is integrated into semiconductor chip 300 as shown by FIG. 11.

Supplement

Although the distance-measuring imaging device according to the present disclosure has been described based on each of Embodiment 1 to Embodiment 3, the present disclosure is not limited to these embodiments. The present disclosure encompasses forms obtained by making to the embodiments various modifications conceived by a person with an ordinary skill in the art as well as forms achieved by combining elements of different embodiments without departing from the gist of the present disclosure.

(1) In Embodiment 1, distance-measuring imaging device 1 has been described as including timing controller 100, phase adjustment circuit 2, light source driver 201, exposure driver 202, light source 203, and light receiver 204. However, distance-measuring imaging device 1 is not limited to a configuration containing all of these elements. As long as distance-measuring imaging device 1 has a configuration containing at least timing controller 100, light receiver 204, and phase adjustment circuit 2, distance-measuring imaging device 1 may have a configuration in which light source 203 and light source driver 201 are disposed outside.

(2) In Embodiment 1, distance-measuring imaging device 1 has been described as including first DLL circuit 5A and second DLL circuit 5B and reducing a variation in light emission start timing and a variation in light emission stop timing accurately. In this respect, as another example, distance-measuring imaging device 1 may include at least one of first DLL circuit 5A or second DLL circuit 5B, and may be configured to reduce at least one of a variation in light emission start timing or a variation in light emission stop timing accurately.

Moreover, in Embodiment 1, distance-measuring imaging device 1 has been described as including third DLL circuit 8A and fourth DLL circuit 8B and reducing a variation in exposure start timing and a variation in exposure stop timing accurately. In this respect, as another example, distance-measuring imaging device 1 may include at least one of third DLL circuit 8A or fourth DLL circuit 8B, and may be configured to reduce at least one of a variation in exposure start timing or a variation in exposure stop timing accurately.

Furthermore, in Embodiment 1, distance-measuring imaging device 1 has been described as including first DLL circuit 5A, second DLL circuit 5B, third DLL circuit 8A, and fourth DLL circuit 8B and reducing a variation in light emission timing and a variation in exposure timing accurately. In this respect, as another example, distance-measuring imaging device 1 may include first DLL circuit 5A and second DLL circuit 5B, and may be configured to reduce a variation in light emission timing accurately, or may include third DLL circuit 8A and fourth DLL circuit 8B, and may be configured to reduce a variation in exposure timing accurately.

(3) In Embodiment 1, fixed delay element 32A has been described as the replica circuit of variable delay element 31A. However, as long as fixed delay element 32A is a delay element for which a delay time is fixed to the minimum delay time or maximum delay time of variable delay element 31A, fixed delay element 32A need not always be limited to the replica circuit of variable delay element 31A.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The distance-measuring imaging device according to the present disclosure is widely applicable to, for example, apparatuses that measure a distance to a subject.

The invention claimed is:

1. A distance-measuring imaging device, comprising:
a timing controller that outputs one or more timing signals;
a light receiver that receives reflected light that is light emitted by a light source and reflected by a subject, and outputs a signal used for measuring a distance to the subject; and
a phase adjustment circuit that outputs at least one signal out of a light emission control signal and an exposure control signal, based on the one or more timing signals, the light emission control signal being used for causing the light source to emit light to the subject, the exposure control signal being used for causing the light receiver to start exposure,
wherein the phase adjustment circuit includes one or more delay-locked loop (DLL) circuits each of which determines, for at least one of the one or more timing signals, at least one of a phase of a rising edge or a phase of a falling edge of the at least one signal.

2. The distance-measuring imaging device according to claim 1,
wherein the one or more DLL circuits comprise a first DLL circuit that determines the phase of the rising edge of the at least one signal; and a second DLL circuit that determines the phase of the falling edge of the at least one signal, and
the phase adjustment circuit further includes a first edge synthesis circuit that synthesizes the rising edge the phase of which has been determined by the first DLL circuit and the falling edge the phase of which has been determined by the second DLL circuit, to output the at least one signal.

3. The distance-measuring imaging device according to claim 2,
wherein the first DLL circuit determines a phase of a rising edge of the light emission control signal,
the second DLL circuit determines a phase of a falling edge of the light emission control signal,
the one or more DLL circuits further comprise a third DLL circuit that determines a phase of a rising edge of the exposure control signal, and a fourth DLL circuit that determines a phase of a falling edge of the exposure control signal,
the one or more timing signals comprise a first timing signal, a second timing signal, a third timing signal, and a fourth timing signal,
the phase adjustment circuit further includes:
a first edge detection circuit that separates a first feedback signal outputted from a light source driver that drives the light source, into (i) a first edge detection signal synchronized with a rising edge of the first feedback signal and (ii) a second edge detection signal synchronized with a falling edge of the first feedback signal; and
a second edge detection circuit that separates a second feedback signal outputted from an exposure driver that drives the light receiver, into (i) a third edge detection signal synchronized with a rising edge of the second feedback signal and (ii) a fourth edge detection signal synchronized with a falling edge of the second feedback signal,
the first DLL circuit compares the first timing signal and the first edge detection signal to determine the phase of the rising edge of the light emission control signal,
the second DLL circuit compares the second timing signal and the second edge detection signal to determine the phase of the falling edge of the light emission control signal,
the third DLL circuit compares the third timing signal and the third edge detection signal to determine the phase of the rising edge of the exposure control signal,
the fourth DLL circuit compares the fourth timing signal and the fourth edge detection signal to determine the phase of the falling edge of the exposure control signal,
the first edge synthesis circuit outputs the light emission control signal, and
the phase adjustment circuit further includes a second edge synthesis circuit that synthesizes the rising edge the phase of which has been determined by the third DLL circuit and the falling edge the phase of which has been determined by the fourth DLL circuit, to output the exposure control signal.

4. The distance-measuring imaging device according to claim 3, further comprising:
the light source driver and the exposure driver.

5. The distance-measuring imaging device according to claim 2, wherein the first DLL circuit determines a phase of a rising edge of the light emission control signal, the second DLL circuit determines a phase of a falling edge of the light emission control signal, the one or more DLL circuits further comprise a third DLL circuit that determines a phase of a rising edge of the exposure control signal, and a fourth DLL circuit that determines a phase of a falling edge of the exposure control signal, the one or more timing signals comprise a first timing signal, a second timing signal, a third timing signal, and a fourth timing signal, the phase adjustment circuit further includes:
 a first edge detection circuit that separates a first feedback signal outputted from a photoelectric converter that receives light directly from the light source, into (i) a first edge detection signal synchronized with a rising edge of the first feedback signal and (ii) a second edge detection signal synchronized with a falling edge of the first feedback signal; and
 a second edge detection circuit that separates a second feedback signal outputted from an exposure driver that drives the light receiver, into (i) a third edge detection signal synchronized with a rising edge of the second feedback signal and (ii) a fourth edge detection signal synchronized with a falling edge of the second feedback signal, the first DLL circuit compares the first timing signal and the first edge detection signal to determine the phase of the rising edge of the light emission control signal, the second DLL circuit compares the second timing signal and the second edge detection signal to determine the phase of the falling edge of the light emission control signal, the third DLL circuit compares the third timing signal and the third edge detection signal to determine the phase of the rising edge of the exposure control signal, the fourth DLL circuit compares the fourth timing signal and the fourth edge detection signal to determine the phase of the falling edge of the exposure control signal, the first edge synthesis circuit outputs the light emission control signal, and the phase adjustment circuit further includes a second edge synthesis circuit that synthesizes the rising edge the phase of which has been determined by the third DLL circuit and the falling edge the phase of which has been determined by the fourth DLL circuit, to output the exposure control signal.

6. The distance-measuring imaging device according to claim 5, further comprising:
 the photoelectric converter and the exposure driver.

7. The distance-measuring imaging device according to claim 1,
 wherein at least one of the one or more DLL circuits includes a shift register that delays at least one of the one or more timing signals, and outputs the at least one signal, based on the at least one of the one or more timing signals delayed by the shift register.

8. The distance-measuring imaging device according to claim 1,
 wherein at least one of the one or more DLL circuits includes:
  a loop filter;
  a charge pump that supplies voltage to the loop filter; and
  a switch that switches between electrically connecting and disconnecting the loop filter and the charge pump.

9. The distance-measuring imaging device according to claim 1,
 wherein at least one of the one or more DLL circuits includes:
  a variable delay element;
  a fixed delay element that receives a signal received by the variable delay element; and
  a phase comparator that compares an output of the variable delay element and an output of the fixed delay element, and outputs a predetermined signal when a phase difference between the outputs satisfies a predetermined condition.

10. The distance-measuring imaging device according to claim 1,
 the timing controller, the light receiver, and the phase adjustment circuit are included in one semiconductor chip.

* * * * *